United States Patent

Shi et al.

[11] Patent Number: 5,705,285
[45] Date of Patent: Jan. 6, 1998

[54] MULTICOLORED ORGANIC ELECTROLUMINESCENT DISPLAY

[75] Inventors: Song Shi, Phoenix; Franky So, Tempe, both of Ariz.; H. C. Lee, Calabasas, Calif.

[73] Assignee: Motorola, Inc., Schaumburg, Ill.

[21] Appl. No.: 706,874

[22] Filed: Sep. 3, 1996

[51] Int. Cl.⁶ .................................................. B32B 9/00
[52] U.S. Cl. .......................... 428/690; 428/195; 428/204; 428/411.1; 428/688; 428/913; 428/917; 359/640; 345/32; 313/503; 313/504
[58] Field of Search .................... 428/195, 411.1, 428/913, 914, 917, 688, 204, 690; 359/640; 345/32; 313/503, 504

[56] References Cited

U.S. PATENT DOCUMENTS

| | | | |
|---|---|---|---|
| 5,015,999 | 5/1991 | Imai et al. | 340/702 |
| 5,126,214 | 6/1992 | Tokailin et al. | 428/690 |
| 5,294,870 | 3/1994 | Tang et al. | 313/504 |
| 5,337,068 | 8/1994 | Stewart et al. | 345/88 |
| 5,345,322 | 9/1994 | Fergason | 359/53 |

*Primary Examiner*—William Krynski
*Attorney, Agent, or Firm*—Kenneth M. Massaroni; Kelly A. Gardner

[57] ABSTRACT

An organic electroluminescent display device includes a plurality of pixels (10) including a substrate (12) upon which is disposed on a plurality of different light influencing elements, (14) (16) (18). Deposited atop each light influencing element is an organic electroluminescent display element (22) which is adapted to emit light of a preselected wavelength. A layer of an insulating, planarizing material (20) may optionally be disposed between the light influencing elements and the OED. Each of the light influencing elements is adapted to generate a different effect in response to light of a preselected incident thereon. In this way, it is possible to achieve a red, green, blue organic electroluminescent display assembly using a single organic electroluminescent display device.

11 Claims, 1 Drawing Sheet

MULTICOLORED ORGANIC ELECTROLUMINESCENT DISPLAY

TECHNICAL FIELD

This invention relates in general to flat panel information display devices, and in particular to light emitting organic electroluminescent information display devices.

BACKGROUND OF THE INVENTION

Until fairly recently, the preferred, indeed the only means by which to display information in the electronic medium was to use a video monitor comprising a cathode ray tube ("CRT"). CRT technology has been well known for over 50 years, and has gained widespread commercial acceptance in applications ranging from desktop computer modules to home televisions and industrial applications. CRTs are essentially large vacuum tubes having one substantially planar surface upon which information is displayed. Coated on the inside of the CRT planar surface is a layer of phosphors which respond by emitting light when struck by electrons emitted from the electron gun of the CRT. The electron gun is disposed in an elongated portion which extends away from the inside of the CRT display surface.

While CRTs are widely used in numerous applications, there are several inherent limitations to the application of CRT technology. For example, CRTs are relatively large and consume a great deal of energy. Moreover, as they are fabricated of glass, the larger the display surface, the heavier the CRT. Given the need for the electron gun to be spacedly disposed from the phosphors surface of the display surface, CRTs have a substantial depth dimension. Accordingly, CRTs have little use in small and portable applications, such as handheld televisions, laptop computers, and other portable electronic applications which require the use of displays.

To answer the needs of the marketplace for smaller, lighter, more portable display devices, manufacturers have created numerous types of flat panel display devices. Examples of flat panel display devices include active matrix liquid crystal displays (AMLCD's), plasma displays, and electroluminescent displays. Each of these types of displays has use for a particular market application, though each is accompanied by various limitations which make them less than ideal for certain applications. Principal limitations inherent in devices such as AMLCD's relate to the fact that they are fabricated predominantly of inorganic semiconductor materials by semiconductor fabrication processes. These materials and processes are extremely expensive, and due to the complexity of the manufacturing process, cannot be reliably manufactured in high yields. Accordingly, the costs of these devices are very high with no promise of immediate cost reduction.

One preferred type of device which is currently receiving substantial research effort is the organic electroluminescent device. Organic electroluminescent devices ("OED") are generally composed of three layers of organic molecules sandwiched between transparent, conductive and/or metallic conductive electrodes. The three layers include an electron transporting layer, an emissive layer, and a hole transporting layer. Charge carriers specifically, electrons and holes, are generated in the electron and hole transporting region. Electrons are negatively charged atomic particles and holes are the positively charged counterparts. The charge carriers are injected into the emissive layer, where they combine, emitting light. OED's are attractive owing to their thin profile, light weight, and low driving voltage, i.e., less than about 20 volts. Hence, they have a potential application as full color flat emissive displays.

One of the serious drawbacks attributable to OED's has been the difficulty encountered in achieving full color, i.e., red, green, blue ("RGB") display devices. This is owing to the fact that different organic materials will emit light at different wavelengths, and hence, different colors. For example, finding EL materials which provide outstanding red and blue colors with high color purity has heretofore been extremely difficult with the materials that have been available.

In view of the fact that emissive materials that can provide the desired colors have been difficult to identify, routineers in the field have attempted to augment the OED's with other devices so as to achieve the desired colors. For example, in U.S. Pat. No. 5,015,999 there is disclosed an OED device which emits radiation in the ultraviolet portion of the electromagnetic spectrum. This ultraviolet radiation is then passed through a filter which fluoresces blue light in response to the ultraviolet light generated by the OED. This approach has several limitations to its successful implementation. First, and foremost is the fact that there is not commercially available any OED which reliability emits radiation in the ultraviolet region. Moreover, devices such as those described in the '999 patent do not appear to be able to provide RGB display devices.

U.S. Pat. No. 5,126,214 discloses a device in which an OED emits light in the blue portion of the electromagnetic spectrum. This blue light is then passed through a fluorescent device so as to generate a RGB display. Likewise, U.S. Pat. No. 5,294,870 generates blue light from an OED, passing the same through an RGB fluorescent filter. In both cases, however, the device is limited by the fact that blue emitting organic electrolumiscent displays have a limited thermal stability window, and poor efficiency. Moreover, the device disclosed in the '214 patent appears to be characterized by limited lumous efficiency, i.e, maximum on the order of approximately 2.55 foot lamberts per watt ("lm/W").

Accordingly, there exists a need for a display device capable of reliability providing full color information thereon. The device should make use of a stable organic electroluminescent display element properly modified to provide red, green, and blue light as desired. Moreover, the display should be pixelated in order to assure high resolution information display.

BRIEF DESCRIPTION OF THE DRAWINGS

The accompanied drawings, which are incorporated in and constitute a part of the specification, illustrate the preferred embodiments of the invention, together with the detailed description of the preferred embodiments given below, serve to explain the principles of the invention. Since device feature dimensions are often in sub-micrometer ranges, the drawings are scaled for ease of visualization rather than dimensional accuracy.

DETAILED DESCRIPTION OF THE PREFERRED EMBODIMENT

Figure 1:
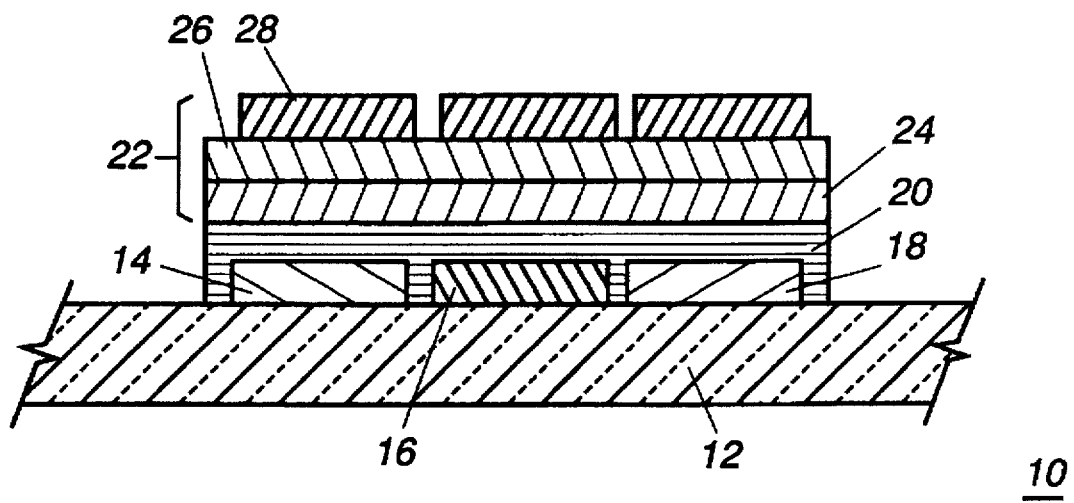
FIG. 1 is a cross-sectional side view of a full color organic electroluminescent display assembly in accordance with the instant invention.

While the specification concludes with claims defining the features of the invention that are regarded as novel, it is believed that the invention will be better understood from a consideration of the following description in conjunction with the drawing figures, in which like reference numerals are carried forward.

Referring now to FIG. 1, there is illustrated therein a cross-sectional side view of a single display pixel 10 in a multi-color organic electroluminescent display assembly or device. The pixel 10 is fabricated upon a first substrate 12, which is transparent and which may be fabricated of any of a number of known materials employed in the art. Examples of materials from which substrate 12 may be fabricated include, but are not limited to, glass, such as Corning 7059 glass, soda line glass, transparent plastic substrates made of polyolefins, polyethersulfones, polyarylates, and combinations thereof. In one preferred embodiment, the substrate 12 is fabricated of a high quality glass such as Corning 7059 glass appropriate for use in flat panel display applications.

Disposed atop one major surface of display substrate 12 is a plurality of light influencing elements 14, 16 and 18. The light influencing elements are adapted to change or otherwise alter the character of light passing therethrough. Accordingly, light influencing elements may be selected from a number of different devices adapted for such purpose, examples of which include light filters, polarizers, lenses such as Fresnel lenses, elements which fluoresce in response to a particular wavelength of light incident, and combinations thereof. In the embodiment of FIG. 1, the light influencing elements 14, 16, and 18, are adapted to filter light of a preselected wavelength in such as manner so as to provide red, green, and blue light.

In a preferred embodiment of the instant invention therefore, the first light influencing element 14 is a fluorescing element which is adapted to absorb light having a wavelength of between approximately 4000 and 6000Å and fluoresce light having a wavelength of 6000 to 7000Å in response thereto. Accordingly, element 14 absorbs blue green light (for reasons which will be explained in greater detail hereinbelow) and fluoresces red light. Conversely, light influencing element 16 is a light filter adapted to allow only light having a wavelength of approximately 4800Å to 6000Å to pass through (transmit), thus filtering out light of other wavelengths. Similarly, light influencing element 18 is a light filtering element adapted to allow only light having a wavelength of between approximately 4200-5000Å to pass through (transmit), filtering out light of other wavelengths.

Deposited atop light influencing elements 14, 16, and 18 is a layer of insulating, planarizing material 20. The insulating planarizing layer is provided so as to ensure a relatively smooth surface upon which a subsequent organic electroluminescent display device will be deposited. The layer 20 also protects the underlying light influencing elements 14, 16, and 18 from being damaged or deformed during subsequent processing. As is well known in the art, such a device must be fabricated upon an appropriate substrate in order to insure it will work appropriately. In this regard, the insulating, planarizing layer 20 is fabricated of any of a number of materials known in the art. Preferred materials for layer 20 include organic monomers or polymers that can be polymerized and/or crosslinked after deposition to generate a rigid surface. Silicon oxide prepared by sol-gel process can also be used as layer 20.

Alternatively, the insulating, planarizing layer may be a second sheet of substrate material such as that disclosed hereinabove with respect to first substrate 12. In this embodiment, the light influencing elements 14, 16 and 18, would then be sandwiched between two layers of a substrate 12 and 20.

Deposited atop the layer of insulating, planarizing material 20 on the side thereof opposite each individual light influencing element, is an organic electroluminescent display device 22 aligned with the underneath light influencing elements. In a preferred embodiment, the OED 22 is adapted to emit light having a wavelength of between 4000 and 6000 Å. It is well known in the art that light having a wavelength of between 4000 and 6000Å is a blue/green light. Accordingly, it may now be appreciated that emitted light having this wavelength and striking light influencing element 14 will result in element 14 fluorescing red light. Blue/green light having a wavelength of between 4000 and 6000Å which passes through a light influencing element 16 adapted to allow only light having a wavelength of between 4800 and 6000Å to pass through will result in the light being essentially green, as the entire blue component has been filtered out. Similarly, by passing light through light influencing element 18 which is adapted to allow light having a wavelength of between 4200 and 5000Å to pass through, will result in substantially all of the green light being filtered out leaving only blue light being transmitted by light influencing element 18. It thus becomes apparent that the pixel 10 is capable of providing red light from light influencing element 14, green light from light influencing element 16 and blue light from light influencing element 18.

In order to achieve an organic electroluminescent display device 22 capable of emitting light having a wavelength of between 4000 and 6000Å, one must simply fabricate an OED as is well known in the art. Specifically, an organic electroluminescent display device comprises a plurality of layers of organic materials sandwiched between two electrically conductive electrodes, at least one of which is semi-transparent to transparent to visible light. It is well known in the art that in a passive driving display device, both electrically conductive electrodes must be patterned to form a x-y addressable matrix; in a active driving display device, only one of the electrodes needs to be patterned. The multicolor OED display device disclosed in the invention may be drived by either a passive or active driving scheme, although only a passive drived OED is presented as follows.

Accordingly, a first electrode 24 is deposited atop the layer of insulating planarizing material 20 which is patterned in laterally-spaced rows in the final display and aligned with the underneath light influencing elements. The first electrode may be fabricated of, for example, conducive metal oxides, such as indium oxides, indium tin oxide (ITO), zinc oxide, zinc tin oxide, conductive transparent polymers such as polyaniline and combinations thereof. Alternatively, the electrode may be fabricated of a semi-transparent metal, examples of which include a thin layer (i.e. on the order of less than 500Å) of gold, copper, silver, and combinations thereof.

Thereafter, a plurality of layers of organic materials 26 are deposited on top of the first electrode and part of the layer of insulating, planarizing material 20. The following layers of organic may be included.

A first layer of organic material is deposited atop the first electrode and part of the layer of insulating, planarizing material 20. The first layer is an organic material adapted to accept holes from the first electrode, the holes being for subsequent recombination with electrons in the emitter layer described hereinbelow. The hole injecting layer also acts as a buffer layer to match the thermal and mechanical properties of the first electrode and the subsequent layers of organic materials. One hole injecting layer which may preferably be used herein is disclosed in, for example, U.S. Pat. Nos. 3,935,031 and 4,356,429.

Thereafter, deposited atop the hole injecting layer is a hole transporting layer. The purpose of the hole transporting layer is to facilitate transport of holes from the hole injecting layer to the emitter layer where they are combined with electrons to create photons for the emission of light. A preferred hole transporting material for use in the hole transporting layer is typically characterized by a glass transition temperature of more than 75° C. and preferably more than about 90° C. The hole transporting material may be selected from the group of materials consisting of:

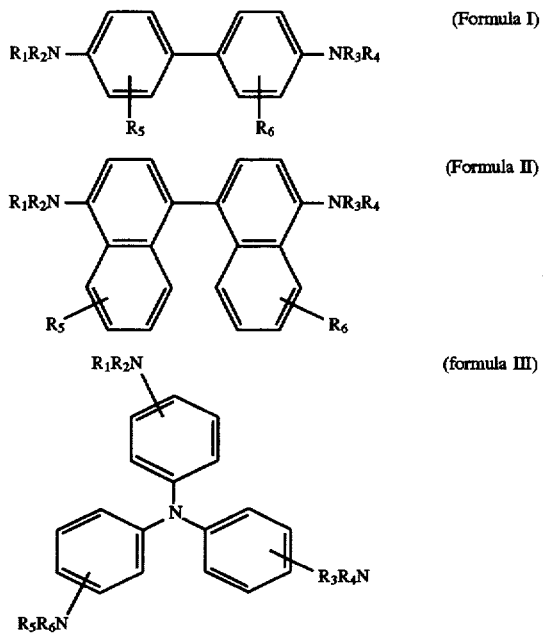

(Formula I)

(Formula II)

(formula III)

wherein $R_1$ and $R_2$, $R_3$, $R_4$, $R_5$, and $R_6$ each independently represent a hydrogen atom, an alkyl group of 1–6 carbons, a halogen group, a cyano group, a nitro group, an aryl group of 6–15 carbons, a fused aromatic group, an alkylamine group, an aryloxy group, and arylamine group, and combinations thereof. In one preferred embodiment, the hole transporting material is specifically selected from the group consisting of 4,4'-bis(N-(1-naphthyl)-N-phenyl amino)-biphenyl, 4,4'-bis(N-(1-naphthyl)-N-phenyl amino)-binaphthyl, 1,3,5-tris(N(1-naphthyl)-N-phenyl amino) benzene, and combinations thereof.

A preferred hole transporting material is disclosed and claimed in commonly-assigned U.S. patent application Ser. No. 08/706,898, filed Sep. 3, 1996 in the names of Song Shi et al, the disclosure of which is incorporated herein by reference.

Thereafter deposited atop the hole transporting layer is a layer of emitter material. The layer of emitter material is typically comprised of a host emitting matrix and a guest emitter. The host emitting matrix is fabricated of a organic material adapted to accommodate both holes and electrons, and then transfer the excited state energies to the guest emitter where the holes and electrons combine and emit a photon of light causing a visible change in the appearance of the OED to a viewer thereof. The materials that can be used in the host emitter matrix include a metal chelated oxinoid compound disclosed in, for example, U.S. Pat. Nos. 4,769, 292, and 5,529,853 as well as organometallic complexes disclosed in commonly assigned, co-pending U.S. patent application Ser. No. 08/304,451, filed Sep. 12, 1994 and entitled "NEW ORGANOMETALLIC COMPLEXES FOR USE IN LIGHT EMITTING DEVICES," the disclosure of which is incorporated herein by reference. Examples of the preferred host emitting matrix materials are selected from the group of tris(8-quinolinol) aluminum, bis(10-oxo-benzo [h] quinoline beryllium bis(2-(oxy-phenyl) benzoxazole) zinc, bis(2-(2-oxy-phenyl)benzophyoxyl)zinc, and combinations thereof. Materials that can be used as a guest emitter include dies and pigments of high fluorescent efficiency. For efficient energy transfer, it is necessary that the guest emitter material has a band gap no greater than that of the material making up the emitter host matrix. It is therefore preferred that the guest emitter material is present in the concentration of between $10^{-3}$ to 10 mole % based on the moles comprised of the emitting host matrix. The selection of the guest emitting matrix is well known to one of ordinary skill in the art.

Deposited atop the emitter layer is an electron transporting layer fabricated of a material selected from the group disclosed in U.S. Pat. No. 4,769,292 and 5,529,853. Alternatively, the material may be such as that disclosed in the aforementioned U.S. patent application Ser. No. 08/304, 451, the disclosure of which is incorporated herein by reference. The electron transporting layer, like the hole transporting layer is adapted to gather charge carriers, in this case, electrons, generated in an electron injecting layer for a transport to the emitter layer where they are combined with holes as described hereinabove. In this regard, characteristics of an appropriate electron transporting layer include those found in the group of tris(8-quinolinol)aluminum, bis(10-oxo-benzo[h] quinoline beryllium bis(2 -(oxy-phenyl)benzoxazole)zinc, bis(2-(2-oxy-phenyl) benzophyoxyl)zinc, and combinations thereof.

Deposited atop the electron transporting layer is an electron injecting layer. The electron injecting layer, like the hole injecting layer, is adapted to accept charge carriers, in this case, electrons. In general, the electron injection layer may be omitted without significant compromise of device performance.

Finally, deposited atop the electron injecting layer is a second electrode 28 which is patterned in laterally-spaced columns and aligned with the light influencing elements 14, 16, and 18 in the final display. The second electrode is typically fabricated of a metal of work function of less than 4 electron volts and at least one other protected metal of higher work function. The preferred low work function metal is selected from the group of lithium, magnesium, calcium, strontium, and combinations thereof, while preferred high work function metal is selected from the group of aluminum, indium, copper, gold, silver and combinations thereof. Alternatively, the second electrode is formed of a alloy of lower work function metal and a high work function metal by color evaporation. The content of the low work function metal and the second electrode can vary from 0.1% to 50% but typically is below about 20%.

In operation, holes inject from the first electrode, also known as the anode, and electrons inject from the second electrode, also known as the cathode, into the organic layers disposed between the electrically conducting electrodes, when an electrical current is applied between the anode and the cathode. An electrical current may be applied by connecting the electrode to electrical current generating means (not shown).

Figure 2:
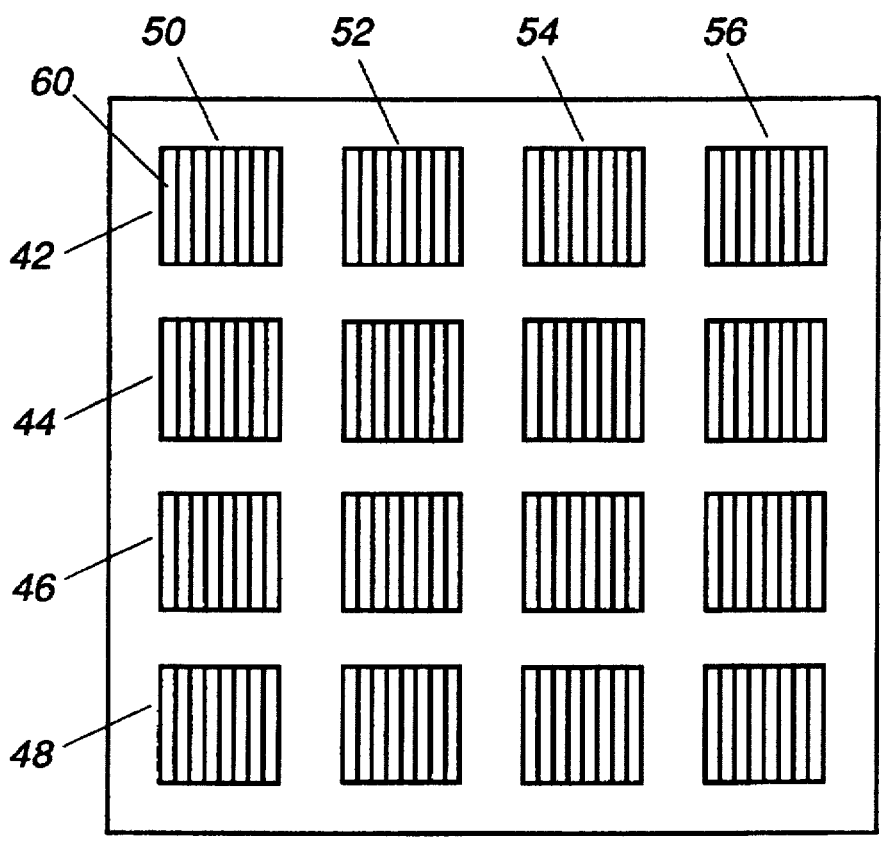
FIG. 2 is a front elevational view of a full color organic electroluminescent display assembly in accordance with the instant invention.

Referring now to FIG. 2, there is illustrated therein an array of discrete light-emitting pixels arranged in a plurality of rows and columns, each pixel being substantially similar to that illustrated hereinabove with respect to FIG. 1. The array 40 is an X by Y matrix of rows and columns including in the embodiment of FIG. 2, four pixels in each row and column yielding a display of 16 pixels. It is to be understood that the subject invention is not so limited. The number of rows and columns and the number of pixels in each row and column may vary according to application. Moreover, pixels need not be necessarily arranged in rows and columns as illustrated herein.

The rows, 42, 44, 46, and 48, are typically fabricated on a common first electrode fabricated of the materials described hereinabove. The first electrode is typically deposited upon the first substrate by methods and processes well known in the art. Conversely, the columns 50, 52, 54, and 56 are defined by single columnar electrodes such as that described hereinabove with respect to the second electrode in the OED. Accordingly, discrete electrodes may be addressed by providing an electrical current along, for example, row 42, and column 50 so that a single pixel 60 is activated by the application of the electrical current.

The OED device described herein provides good conversion efficiencies with light influencing elements, and the overall efficiency of embodied display device is mainly determined by the efficiency of the blue/green-emitting OED. Blue/green-emitting OED's are generally much more efficient and much easier to achieve that a blue-emitting OED. Furthermore, the thermal stability of a blue/green-emitting OED is generally much better that a blue-emitting OED. A light emitting organic electroluminescent information display device in accordance to the present invention with stability up to 100° C. and overall efficiency of 3.0 lm/W can be readily fabricated.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A full color light emitting organic electroluminescent display assembly comprising:

a transparent display substrate;

a light emitting organic electroluminescent display device adapted to emit light of a first wavelength and a plurality of light influencing elements disposed between said substrate and said display device, at least one of said light influencing elements adapted to absorb light emitted by said display device, and fluoresce light of a different wave length than said first wavelength, and at least a second one of said light influencing elements adapted to filter said light emitted by said display device.

2. A display assembly as in claim 1, wherein said organic electroluminescent display device emits light having a wavelength of between 4,000 and 6,000Å.

3. A display assembly as in claim 1, wherein the fluorescing light influencing element fluoresces light having a wavelength of between about 6,000 and 7,000Å.

4. A display assembly as in claim 1, further including at least two light influencing elements adapted to filter light emitted by said display device.

5. A display assembly as in claim 4, wherein one of said two light filtering elements filters light having a light transmision wavelength between about 4,200 and 5,000Å.

6. A display assembly as in claim 4, wherein one of said two light filtering elements filters light having a light transmission wavelength between about 4,800 and 6,000Å.

7. An array of discrete light emitting pixels arranged in a plurality of rows and columns, and disposed upon a transparent substrate, each light emitting pixel comprising:

an organic electroluminescent light emitting element adapted to emit light of a first wavelength;

a first light influencing element adapted to fluoresce light of a different wavelength in response to absorbed light emitted from said light emitting element;

a second light influencing element adapted to filter out a first portion of the light emitted from said light emitting element; and a third light influencing element adapted to filter out a second portion of the light emitted from said light emitting element.

8. An array as in claim 7, wherein said light emitting element emits light having a wavelength of between 4,000 and 6,000Å.

9. An array as in claim 7, wherein said first light influencing element fluoresces light having a wavelength of between about 6,000 and 7,000Å.

10. An array as in claim 7, wherein said second light influencing element filters out light having a light transmission wavelength of between about 4,200 and 5,000Å.

11. An array as in claim 7, wherein said third light influences element filters out light having a light transmission wavelength of between about 4,800 and 6,000Å.

* * * * *